(12) United States Patent
Fischer

(10) Patent No.: US 7,837,825 B2
(45) Date of Patent: Nov. 23, 2010

(54) CONFINED PLASMA WITH ADJUSTABLE ELECTRODE AREA RATIO

(75) Inventor: Andreas Fischer, Castro Valley, CA (US)

(73) Assignee: Lam Research Corporation, Fremont, CA (US)

( * ) Notice: Subject to any disclaimer, the term of this patent is extended or adjusted under 35 U.S.C. 154(b) by 199 days.

(21) Appl. No.: 11/152,022

(22) Filed: Jun. 13, 2005

(65) Prior Publication Data

US 2006/0278340 A1 Dec. 14, 2006

(51) Int. Cl.
H01L 21/00 (2006.01)

(52) U.S. Cl. .............................. 156/345.47; 118/723 E; 118/723 R

(58) Field of Classification Search ............. 118/723 R, 118/723 E; 156/345.43, 345.47, 345.46, 156/345.45, 345.44
See application file for complete search history.

(56) References Cited

U.S. PATENT DOCUMENTS

| | | | |
|---|---|---|---|
| 4,392,932 A | 7/1983 | Harra | |
| 4,632,719 A | 12/1986 | Chow et al. | |
| 4,954,201 A | 9/1990 | Latz | |
| 5,089,083 A | 2/1992 | Kojima et al. | |
| 5,292,399 A | 3/1994 | Lee et al. | |
| 5,534,751 A | 7/1996 | Lenz et al. | |
| 5,534,752 A | 7/1996 | Hua-Chu | |
| 5,660,673 A | 8/1997 | Miyoshi et al. | |
| 5,942,042 A | 8/1999 | Gogh | |
| 5,998,932 A | 12/1999 | Lenz | |
| 6,008,130 A | 12/1999 | Henderson et al. | |
| 6,019,060 A | 2/2000 | Lenz | |
| 6,074,488 A | 6/2000 | Grimard et al. | |
| 6,178,919 B1 | 1/2001 | Li et al. | |

(Continued)

FOREIGN PATENT DOCUMENTS

EP 0 660 499 6/1995

(Continued)

OTHER PUBLICATIONS

"International Search Report", PCT Application No. PCT/US2006/023057, Mailing Date: Sep. 29, 2006.

(Continued)

Primary Examiner—Parviz Hassanzadeh
Assistant Examiner—Michelle Crowell
(74) Attorney, Agent, or Firm—IP Strategy Group, P.C.

(57) ABSTRACT

A plasma reactor comprises a chamber, a bottom electrode, a top electrode, a first set of confinement rings, a second set of confinement rings, and a ground extension. The top and bottom electrodes, the first and second sets of confinement rings, and the ground extension are all enclosed within the chamber. The first set of confinement rings is substantially parallel to the bottom electrode and the top electrode and surrounds a first volume between the bottom electrode and the top electrode. The second set of confinement rings is substantially parallel to the bottom electrode and the top electrode and surrounds a second volume between the bottom electrode and the top electrode. The second volume is at least greater than the first volume. A ground extension is adjacent to and surrounds the bottom electrode. The first set of confinement rings and the second set of confinement rings are capable of being raised and lowered to extend into a region above the ground extension.

23 Claims, 6 Drawing Sheets

U.S. PATENT DOCUMENTS

| | | | |
|---|---|---|---|
| 6,433,484 B1 | 8/2002 | Hao et al. | |
| 6,492,774 B1 * | 12/2002 | Han et al. | 315/111.21 |
| 6,506,685 B2 | 1/2003 | Li et al. | |
| 6,527,911 B1 | 3/2003 | Yen et al. | |
| 6,744,212 B2 | 6/2004 | Fischer et al. | |
| 6,823,815 B2 | 11/2004 | Han et al. | |
| 6,974,523 B2 * | 12/2005 | Benzing et al. | 156/345.47 |
| 2003/0151371 A1 * | 8/2003 | Fischer et al. | 315/111.21 |
| 2005/0016568 A1 * | 1/2005 | Choe et al. | 134/100.1 |
| 2005/0268850 A1 * | 12/2005 | Ma | 118/723 R |
| 2006/0011138 A1 * | 1/2006 | Kang et al. | 118/723 R |
| 2006/0102283 A1 * | 5/2006 | Kwon et al. | 156/345.24 |

FOREIGN PATENT DOCUMENTS

| | | |
|---|---|---|
| EP | 0 665 575 | 8/1995 |
| JP | 60187911 | 2/1987 |
| WO | 99/14788 | 3/1999 |
| WO | 99/67807 | 12/1999 |
| WO | 03/043061 | 5/2003 |

OTHER PUBLICATIONS

"International Preliminary Report on Patentability", PCT Application No. PCT/US2006/023057, Mail Date: Dec. 17, 2007.

"Malaysian Substantive Examination Report", Malaysian Application No. PI 20062734, Mail Date: May 8, 2009.

"Written Opinion of the International Searching Authority", PCT Application No. PCT/US2006/023057, Mail Date: Sep. 29, 2006.

* cited by examiner

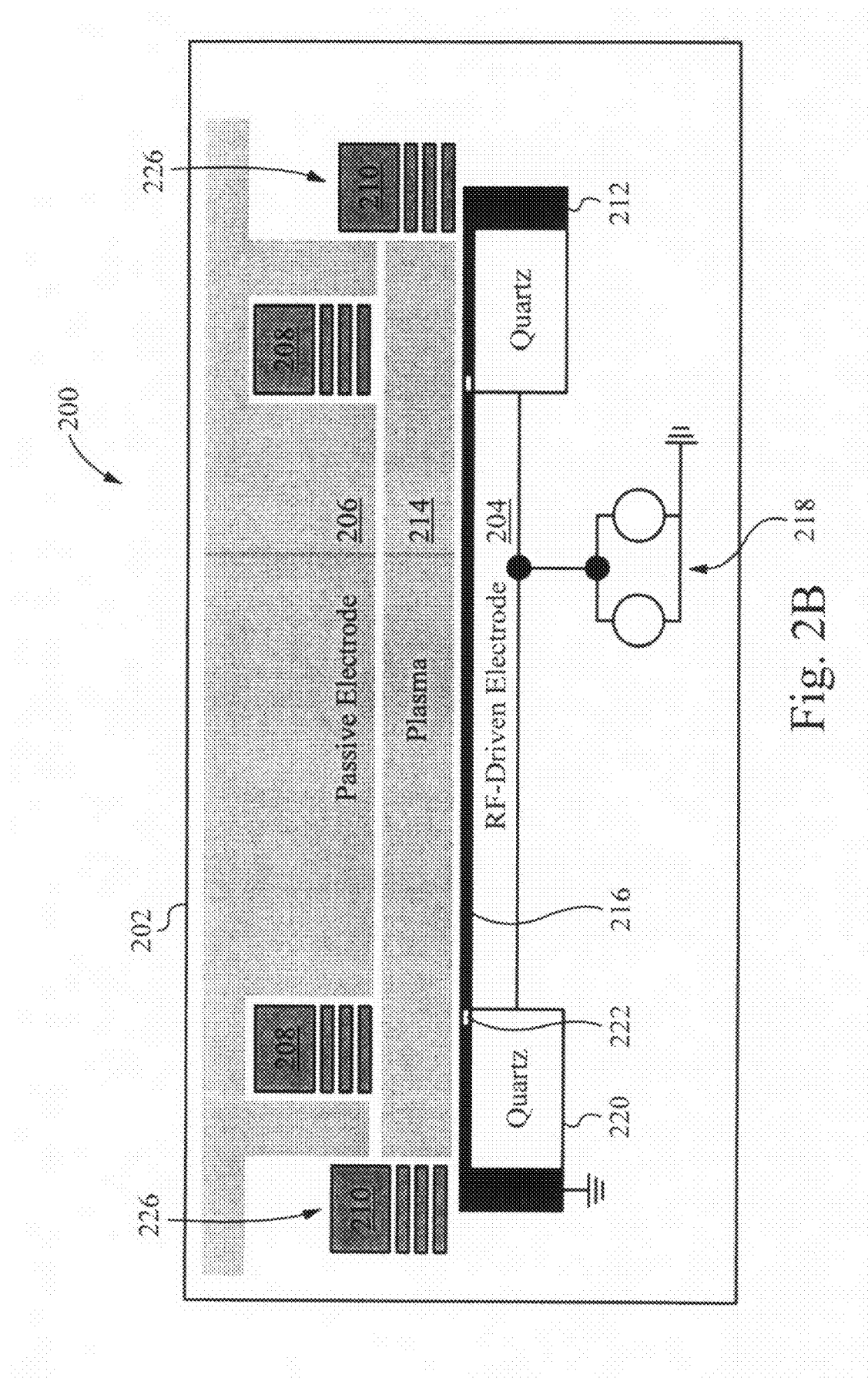

CONFINED PLASMA WITH ADJUSTABLE ELECTRODE AREA RATIO

FIELD OF THE INVENTION

The present invention relates to semiconductor fabrication. More particularly, the present invention relates to a plasma etching apparatus.

BACKGROUND OF THE INVENTION

A typical plasma etching apparatus comprises a reactor in which there is a chamber through which reactive gas or gases flow. Within the chamber, the gases are ionized into a plasma, typically by radio frequency energy. The highly reactive ions of the plasma are able to react with material, such as the dielectric between interconnects or a polymer mask on a surface of a semiconductor wafer during it being processed into Integrated Circuits (IC's). Prior to etching, the wafer is placed in the chamber and held in proper position by a chuck or holder which exposes a top surface of the wafer to the plasma.

In semiconductor processing, the etch or deposition rate uniformity across the wafer during each process directly affects the device yield. This has become one of the main qualifying requirements for a process reactor and hence is considered a very important parameter during its design and development. With each increase in the size of wafer diameter, the problem of ensuring uniformity of each batch of integrated circuits becomes more difficult. For instance, with the increase from 200 mm to 300 mm in wafer size and smaller circuit size per wafer, the edge exclusion shrinks to, for example, 2 mm. Thus maintaining a uniform etch rate, profile, and critical dimensions all the way out to 2 mm from the edge of the wafer has become very important.

In a plasma etch reactor, the uniformity of etch parameters' (etch rate, profile, CD, etc.) is affected by several parameters. Maintaining uniform plasma discharge and hence plasma chemistry above the wafer has become very critical to improve the uniformity. Many attempts have been conceived to improve the uniformity of the wafer by manipulating the gas flow injection through a showerhead, modifying the design of the showerhead, and placing edge rings around the wafer.

One problem in a capacitively-coupled etching reactor having electrodes of different sizes is the lack of uniform RF coupling especially around the edge of a wafer. FIG. 1 illustrates a conventional capacitively-coupled plasma processing chamber 100, representing an exemplary plasma processing chamber of the types typically employed to etch a substrate. Referring now to FIG. 1, a chuck 102, representing the workpiece holder on which a substrate, such as a wafer 104, is positioned during etching. Chuck 102 may be implemented by any suitable chucking technique, e.g., electrostatic, mechanical, clamping, vacuum, or the like. During etching, chuck 102 is typically supplied with dual RF frequencies (a low frequency and high frequency), for example 2 MHz and 27 MHz, simultaneously during etching by a dual frequency source 106.

An upper electrode 108 is located above wafer 104. Upper electrode 108 is grounded. FIG. 1 illustrates an etching reactor where the surface area of upper electrode 108 is larger than the surface area of chuck 102 and wafer 104. During etching, plasma 110 is formed from etchant source gas supplied via a gas line 112 and pumped out through an exhaust line 114.

When RF power is supplied to chuck 102 from RF power source 106, equipotential field lines are set up over wafer 104. The equipotential field lines are the electric field lines across the plasma sheath that is between wafer 104 and the plasma 110.

During plasma processing, the positive ions accelerate across the equipotential field lines to impinge on the surface of wafer 104, thereby providing the desired etch effect, such as improving etch directionality. Due to the geometry of the upper electrode 108 and the chuck 102, the field lines may not be uniform across the wafer surface and may vary significantly at the edge of the wafer 104. Accordingly, a focus ring 118 is typically provided to improve process uniformity across the entire wafer surface.

An electrically conductive shield 120 substantially encircles the focus ring 118. Electrically conductive shield 120 is configured to be grounded within the plasma processing chamber. Shield 120 prevents the presence of unwanted equipotential field lines outside of focus ring 118.

Confinement rings 116 may be placed between upper electrode 108 and a bottom electrode, such as the chuck 102 in FIG. 2. In general, confinement rings 116 help confine the etching plasma 110 to the region above the wafer 104 to improve process control and to ensure repeatability. Confinement rings 116 are positioned at a predetermined radial distance from wafer 104 posing a physical barrier for further plasma expansion. However, because the diameter of confinement rings 116 cannot be changed, the diameter of plasma 110 and thus its cross-section is nearly a fixed quantity for all processes. Thus, the active electrode area ratio, which is defined as the surface area of the grounded electrode divided by the surface area of the RF electrode, is static for a plasma reactor having confinement rings statically positioned.

Accordingly, a need exists for a method and apparatus for confining plasma with an adjustable electrode area ratio. A primary purpose of the present invention is to solve these needs and provide further, related advantages.

BRIEF DESCRIPTION OF THE INVENTION

A plasma reactor comprises a chamber, a bottom electrode, a top electrode, a first set of confinement rings, a second set of confinement rings, and a ground extension. The top and bottom electrodes, the first and second sets of confinement rings, and the ground extension are all enclosed within the chamber. The first set of confinement rings is substantially parallel to the bottom electrode and the top electrode and surrounds a first volume between the bottom electrode and the top electrode. The second set of confinement rings is substantially parallel to the bottom electrode and the top electrode and surrounds a second volume between the bottom electrode and the top electrode. The second volume is at least greater than the first volume. A ground extension is adjacent to and surrounds the bottom electrode. The first set of confinement rings and the second set of confinement rings are capable of being raised and lowered to extend into a region above the ground extension.

BRIEF DESCRIPTION OF THE DRAWINGS

The accompanying drawings, which are incorporated into and constitute a part of this specification, illustrate one or more embodiments of the present invention and, together with the detailed description, serve to explain the principles and implementations of the invention.

In the drawings:

FIG. 2B is a diagram schematically illustrating a plasma reactor having an inner set of confinement rings raised and an outer set of confinement rings lowered in accordance with one embodiment.

DETAILED DESCRIPTION

Figure 1:
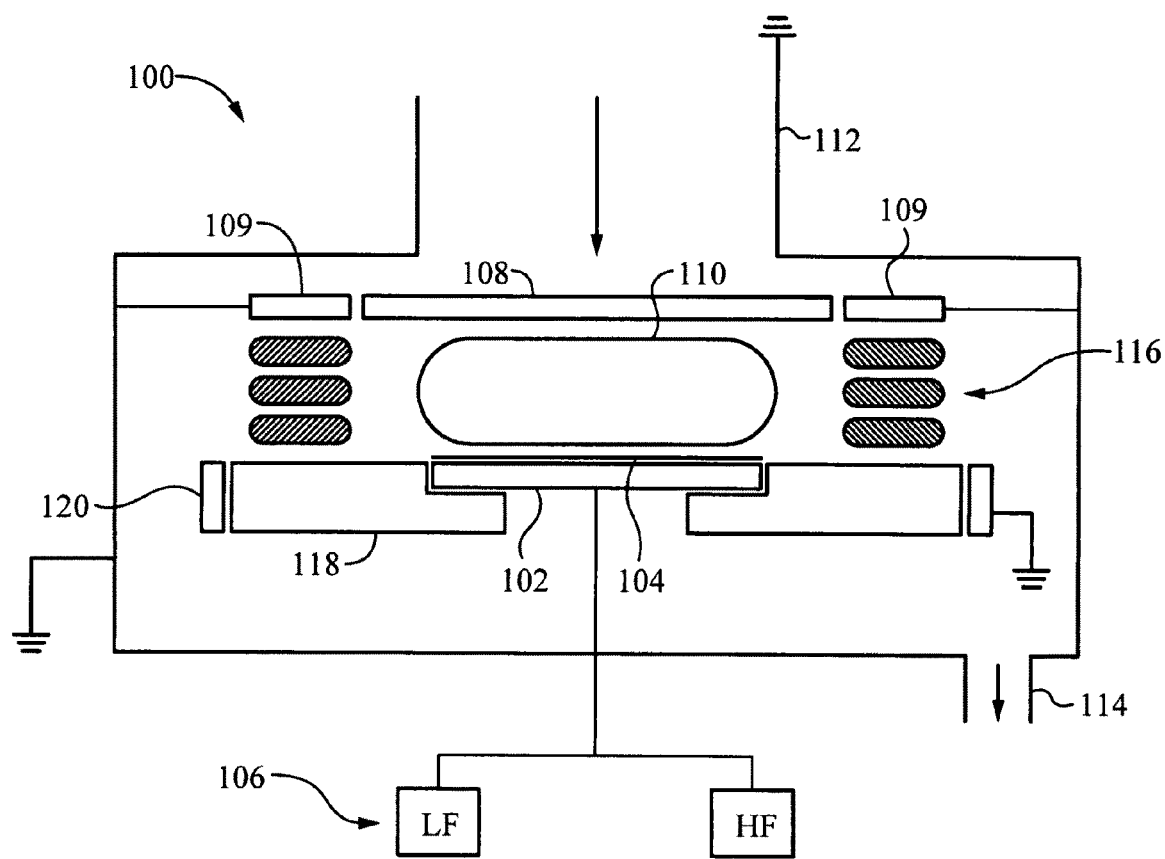
FIG. 1 is a diagram schematically illustrating a plasma reactor in accordance with a prior art.

Embodiments of the present invention are described herein in the context of confined plasma with adjustable electrode area ratio. Those of ordinary skill in the art will realize that the following detailed description of the present invention is illustrative only and is not intended to be in any way limiting. Other embodiments of the present invention will readily suggest themselves to such skilled persons having the benefit of this disclosure. Reference will now be made in detail to implementations of the present invention as illustrated in the accompanying drawings. The same reference indicators will be used throughout the drawings and the following detailed description to refer to the same or like parts.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Generating confined plasma for 300 mm applications is difficult because of the higher RF power and higher gas flow rates that are applied during the etching process. It shall be appreciated by those skilled in the art that the apparatus and method described here are not limited to 300 mm applications. The apparatus and method may be adapted to be used for applications requiring the confinement of plasma in a high gas flow environment that employ high RF power levels. In this invention, high gas flow rates refer to flow rates of approximately 2000 sccm, and high RF power levels refer to power levels of approximately 2 W per cm$^3$ of plasma volume.

FIGS. 2A, 2B, 2C, and 2D illustrate one embodiment of a plasma reactor 200 with adjustable electrode area ratio comprising a chamber 202, a bottom RF electrode 204, a top grounded electrode 206, a first (inner) set of confinement rings 208, a second (outer) set of confinement rings 210, and a ground extension 212 for draining charge from the plasma boundaries.

Plasma reactor 200 is configured to receive a gas (not shown) that is converted into a plasma 214 by plasma reactor 200. By way of example and not of limitation, the relatively high gas flow rate that is pumped into chamber 202 is 1500 sccm. Gas flow rates less than 1500 sccm as well as more than 1500 sccm may also be applied.

Bottom RF electrode 204 is configured to receive a workpiece 216 and has an associated bottom electrode area that is adapted to receive workpiece 216. Bottom RF electrode 204 is coupled to at least one power supply 218. Power supply 218 is configured to generate RF power that is communicated to bottom electrode 204.

Top grounded electrode 206 is disposed at a distance above from bottom RF electrode 204. Top grounded electrode 206 together with ground extension 212 is configured to provide a complete electrical circuit for RF power communicated from bottom RF electrode 204. Additionally, top grounded electrode 206 together with ground extension 212 has a ground electrode area that may vary in size based on the position of inner and outer confinement rings 208 and 210, respectively. In one position, the ground electrode area is greater than the RF electrode area. In another position, the ground electrode area is substantially equal to the RF electrode area.

To generate plasma 214 within chamber 202, power supply 218 is engaged and RF power is communicated between bottom RF electrode 204 and top grounded electrode 206. Gas is then converted to plasma 214 that is used for processing workpiece 216 or a semiconductor substrate. By way of example and not of limitation, RF power levels of 2 W per cm$^3$ of plasma volume may be applied. RF power levels of less than 2 W per cm$^3$ of plasma volume may also be applied.

Inner and outer sets of confinement rings (208 and 210 respectively) are disposed near the top electrode area and the bottom electrode area. Inner and outer sets of confinement rings (208 and 210 respectively) are configured to help confine plasma 214 substantially within a volume defined by either set (208 or 210) of confinement rings. Top electrode 206 includes a first notch 224 and a second notch 226 with first notch 224 having a radius that is smaller than a radius of second notch 226. First and second notches 224 and 226 respectively house first and second set of confinement rings 208 and 210. Plasma 214 is generated with the RF power being communicated between top grounded electrode 206 and bottom RF electrode 204.

Ground extension 212 is adjacent to bottom RF electrode 204 and is separated from bottom RF electrode 204 by a first dielectric ring 220 and a second dielectric ring 222. First dielectric ring 220 is configured to receive bottom RF electrode 204 and ground extension 212. Second dielectric ring 222 separates bottom RF electrode 204 from ground extension 212. Second dielectric ring 222 sits in the same plane as ground extension 212 and workpiece 216. Ground extension 212 drains RF current from the plasma boundaries and includes a RF grounded surface. By way of example, ground extension 212 may be made of a conductive material such as aluminum. First and second dielectric rings 220 and 222 may both be made of quartz.

Figure 2A:
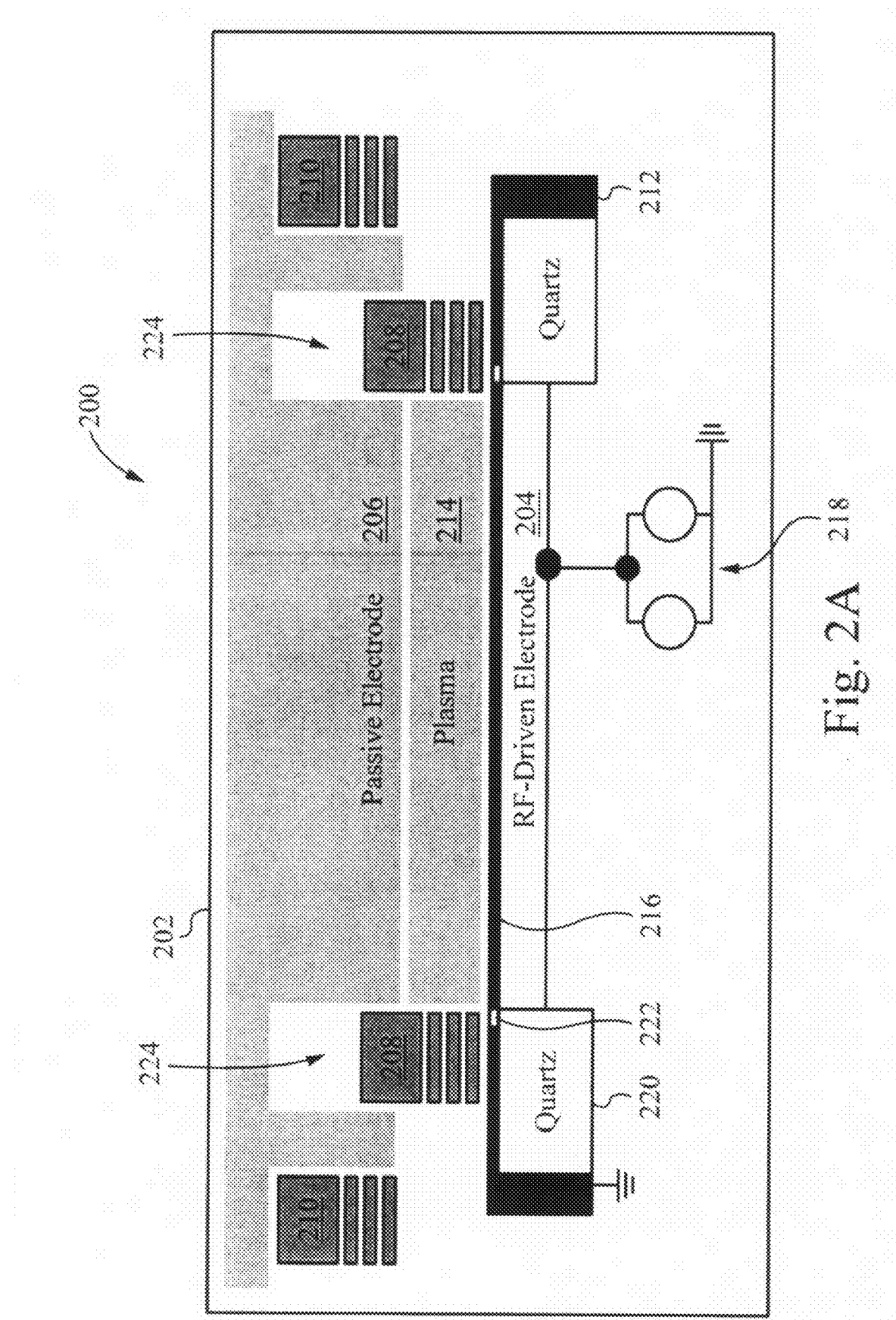
FIG. 2A is a diagram schematically illustrating a plasma reactor having an inner set of confinement rings lowered and an outer set of confinement rings raised in accordance with one embodiment.

For illustrative purposes, plasma reactor 200 described in FIGS. 2A and 2B employs capacitive coupling to generate plasma 214 in processing chamber 202. It shall be appreciated by those skilled in the art, that the present apparatus and method may be adapted to be used with inductively coupled plasma.

Additionally, and for illustrative purposes only, a dual frequency power supply 218 may be used to generate the high electric potential that is applied to a gas to produce plasma 214. More particularly, the illustrated power supply 218 is a dual power frequency power supply operating at 2 MHz and 27 MHz that is included in etching systems manufactured by Lam Research. It shall be appreciated by those skilled in the art that other power supplies capable of generating plasma in the processing chamber 202 may also be employed. It shall be appreciated by those skilled in the art that the invention is not limited to RF frequencies of 2 MHz and 27 MHz but may be applicable to a wide range of frequencies. The invention is also not limited to dual frequency power supplies but is also applicable to systems that have three or more RF power sources with a wide variety of frequencies.

First set (inner) of confinement rings 208 is substantially parallel to bottom RF electrode 204 and top grounded electrode 206 and surrounds a first volume (enclosing plasma 214) between bottom RF electrode 204 and top grounded electrode 206 when first set (inner) of confinement rings 208 is lowered and second set (outer) of confinement rings 210 is raised. Notch 224 houses first set of confinement rings 208 when raised.

Second set (outer) of confinement rings 210 is substantially parallel to bottom RF electrode 204 and top grounded electrode 206 and surrounds a second volume between bottom RF electrode 204 and top grounded electrode 206 when second set (outer) of confinement rings 210 is lowered and first set (inner) of confinement rings 208 is raised. Notch 226 houses second set of confinement rings 210 when raised.

The second volume, defined when second set 210 is lowered, is at least greater than the first volume, defined when first set 208 is lowered. The volume of plasma 214 in FIG. 2B is greater than the volume of plasma 214 in FIG. 2A. The diameter of second set (outer) of confinement rings 210 is at least greater than the diameter of first set (inner) of confinement rings 208. Each set of confinement rings may also include a suspended collapsible stack of individual rings. The gap between each individual ring may be adjustable. For illustration purposes, FIGS. 2A and 2B illustrate each set of confinement rings having four parallel rings. By way of example, both sets of confinement rings 208 and 210 may be made of quartz.

Figure 2C:
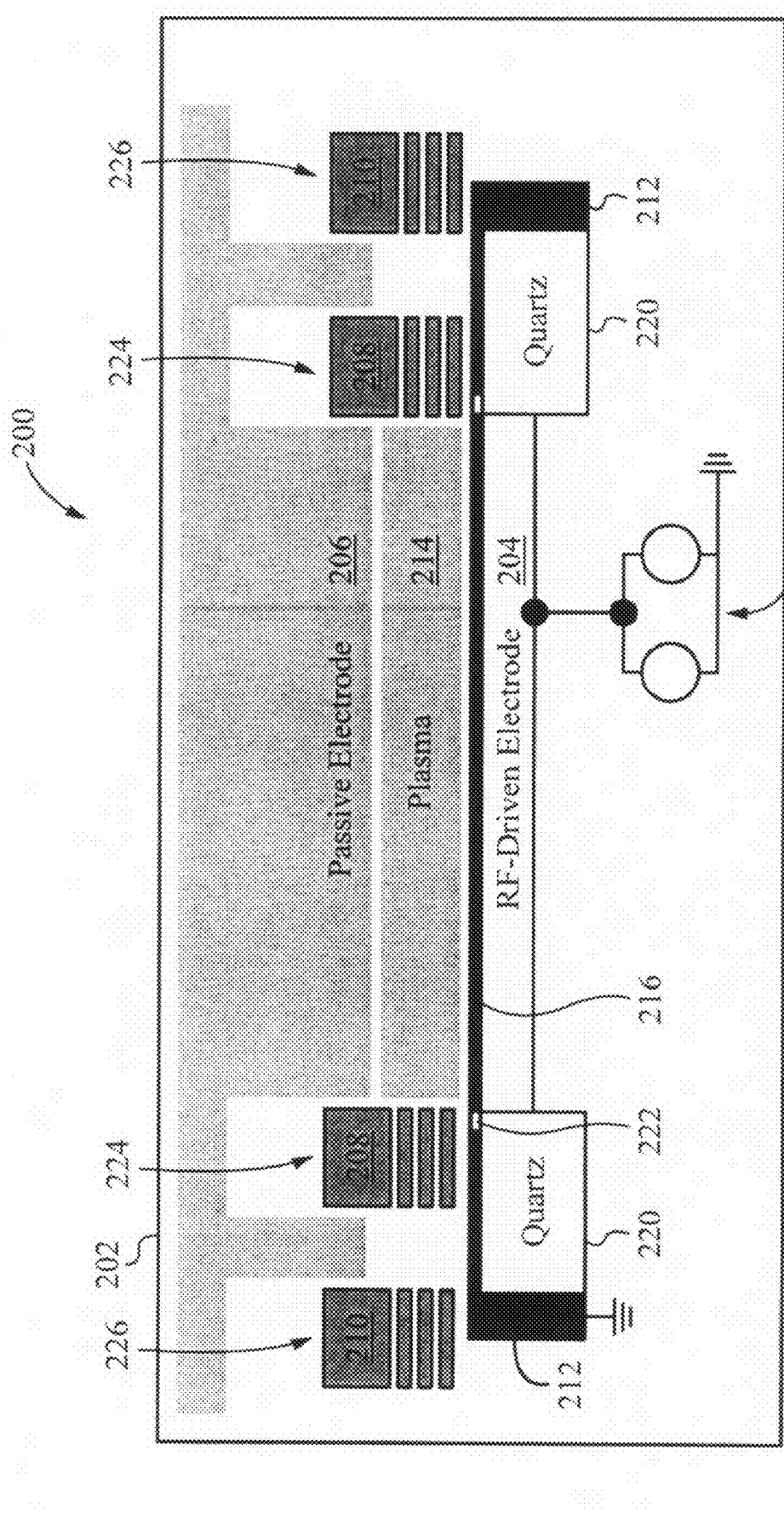
FIG. 2C is a diagram schematically illustrating a plasma reactor having an inner and outer set of confinement rings lowered in accordance with one embodiment.
Figure 2D:
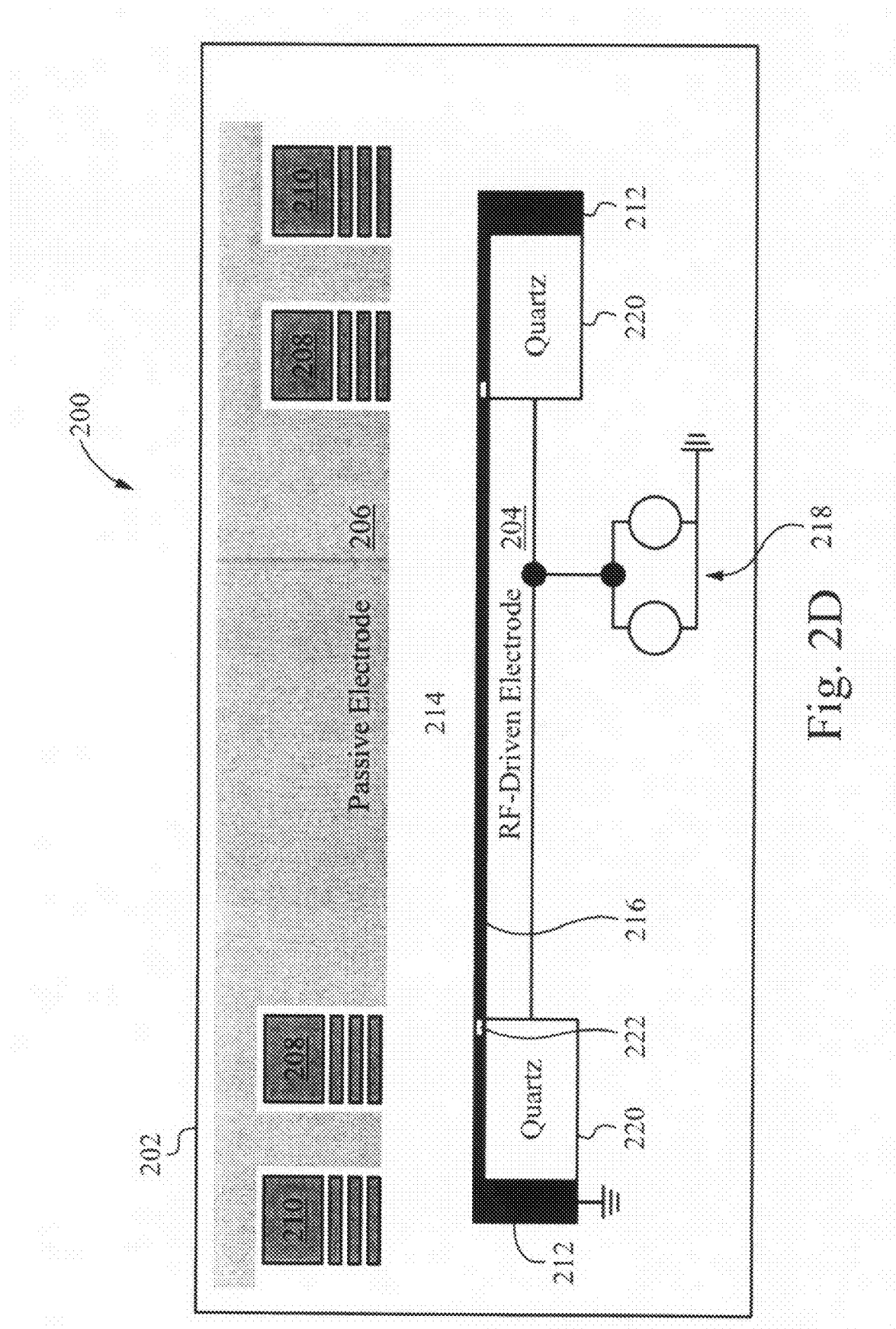
FIG. 2D is a diagram schematically illustrating a plasma reactor having an inner and outer set of confinement rings raised in accordance with one embodiment.

Each set of confinement rings 208 and 210 is capable of being raised and lowered to extend into a region above ground extension 212. First set of confinement rings 208 may be lowered when second set of confinement rings 210 is raised as illustrated in FIG. 2A. First set of confinement rings 208 may be raised when second set of confinement rings 210 is lowered as illustrated in FIG. 2B. Both first and second set of confinement rings 208 and 210 may be lowered as illustrated in FIG. 2C. Both first and second set of confinement rings 208 and 210 may be raised as illustrated in FIG. 2D. Those of ordinary skills in the art will appreciate that there are many ways to lower and raise the sets of confinement rings. For example, a mechanical or motorized knob may be used to raise or lower the confinement rings without having to open and access the interior of chamber 202.

In the configuration illustrated in FIG. 2A, plasma 214 is confined to a cross-section comparable to that of workpiece 216. The grounded top electrode area is about equal to the RF bottom electrode area resulting in an electrode area ratio near unity. As a result, the bias voltage and ion energy at workpiece 216 are very low. The configuration of confinement rings 208 and 210 shown in FIG. 2A would be of particular use for damage-sensitive processes such as Strip or Barrier Open.

In the configuration illustrated in FIG. 2B, plasma 214 can expand much further outward. The effective surface area for grounded top grounded electrode 206 shown in FIG. 2B is substantially greater than the effective surface area for top grounded electrode 206 shown in FIG. 2A. In addition, ground extension 212 is now in contact with plasma 214 effectively increasing the electrode area further. The electrode area ratio between top grounded electrode 206 and bottom RF electrode 204 has increased from FIG. 2A to 2B. This increased area ratio results in an increased bias voltage on bottom RF electrode 204 and a decreased bias voltage on top grounded electrode 206 and outer confinement rings 210. The configuration of confinement rings 208 and 210 shown in FIG. 2B would be of particular use for Via or High Aspect Ratio Contacts (HARC) which require high ion energies for etching.

In the configuration illustrated in FIG. 2C, plasma 214 is confined to a cross-section comparable to that of workpiece 216 since both confinement rings 208 and 210 are lowered providing a double layer barrier for plasma 214. The grounded top electrode area is about equal to the bottom RF electrode area resulting in an electrode area ratio near unity. As a result, the bias voltage and ion energy at workpiece 216 are very low. The configuration of confinement rings 208 and 210 shown in FIG. 2C would be also of particular use for damage-sensitive processes such as Strip or Barrier Open.

In the configuration illustrated in FIG. 2D, plasma 214 can expand past the inner and outer confinement rings 208 and 210 since both confinement rings 208 and 210 are raised. The effective surface area for top grounded electrode 206 shown in FIG. 2D is substantially greater than the effective surface area for top grounded electrode 206 shown in FIGS. 2A, 2B, and 2C. In addition, ground extension 212 is now in contact with plasma 214 effectively increasing the electrode area further. The electrode area ratio between top grounded electrode 206 and bottom RF electrode 204 has increased from FIGS. 2A, 2B, 2C to FIG. 2D. This increased area ratio results in an increased bias voltage on bottom RF electrode 204 and a decreased bias voltage on top grounded electrode 206. The configuration of inner and outer confinement rings 208 and 210 shown in FIG. 2D would be also of particular use for Via or High Aspect Ratio Contacts (HARC) which require high ion energies for etching.

Those of ordinary skill in the art will appreciate that the above configurations shown in FIGS. 2A, 2B, 2C, and 2D are not intended to be limiting and that other configurations can be used without departing from the inventive concepts herein disclosed. For example, at least two or more sets of confinement rings may be positioned to further control the electrode area ratio.

Figure 3:
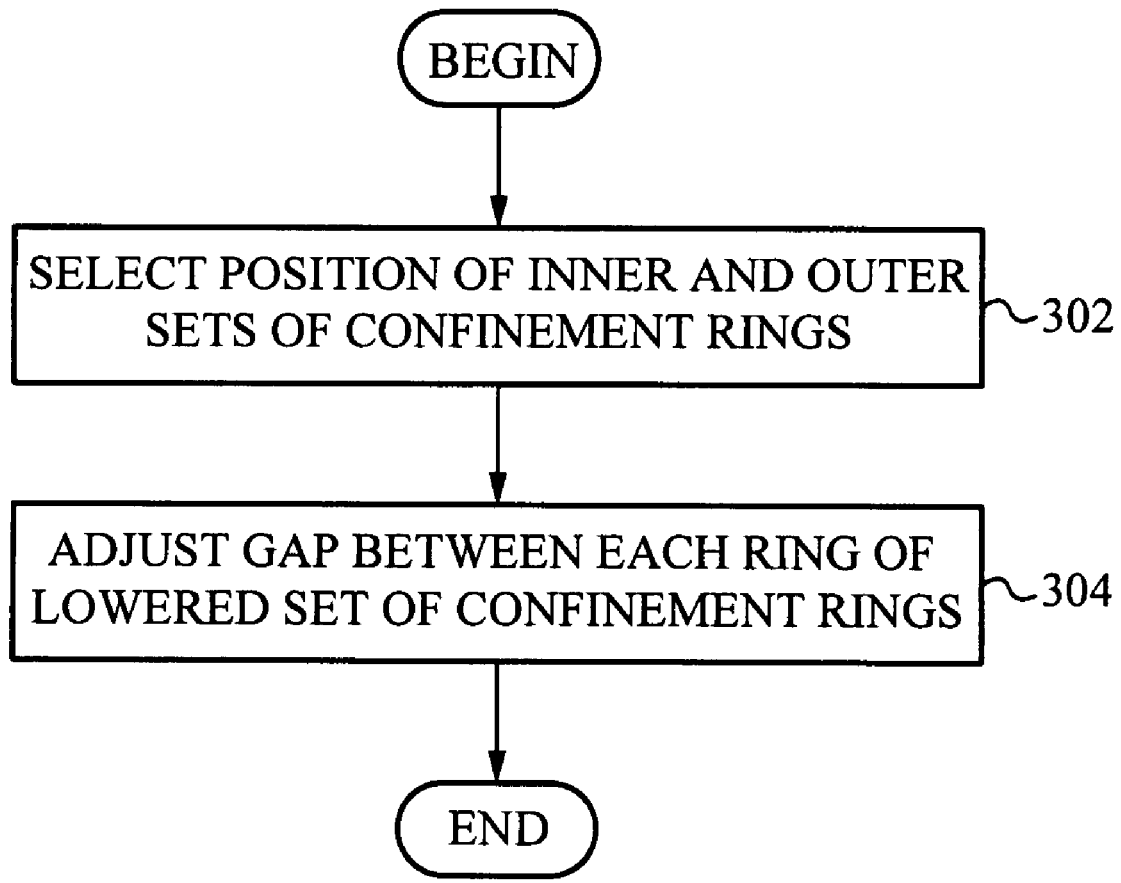
FIG. 3 is a flow diagram schematically illustrating a method for operating the plasma reactor illustrated in FIGS. 2A, 2B, 2C, and 2D.

FIG. 3 illustrates a method for using the plasma reactor illustrated in FIGS. 2A, 2B, 2C, and 2D. At 302, the position (raised or lowered) for each inner and outer set of confinement rings is selected. The inner and outer sets of confinement rings are capable of being raised and lowered to extend into a region above the ground extension. The inner set of confinement rings may be configured to be lowered when the second set of confinement rings is raised, and vice-versa. At 304, the gap between each confinement ring of the lowered set of confinement rings (inner, outer, or none) may also be adjusted. Both sets of confinement rings may also be lowered and raised at the same time as illustrated in FIGS. 2C and 2D.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims.

What is claimed is:

1. A plasma reactor comprising:
   a chamber;
   a bottom electrode and a top electrode enclosed within said chamber, wherein said top electrode and said bottom electrode are separated by a vertical distance, said top electrode including a first notch and a second notch, said top electrode further including a top electrode portion disposed between said first notch and said second notch;
   a first set of confinement rings surrounded by said top electrode portion, said first set of confinement rings including a first plurality of confinement rings, all confinement rings of said first plurality of confinement rings being disposed inside said first notch, said first set of confinement rings surrounding a first volume between said bottom electrode and said top electrode when said set of first set of confinement rings is in a lowered position of said first set of confinement rings; and
   a second set of confinement rings surrounding said top electrode portion, said second set of confinement rings including a second plurality of confinement rings, all confinement rings of said second plurality of confinement rings being disposed inside said second notch, said second set of confinement rings surrounding a second volume between said bottom electrode and said top electrode when said second set of confinement rings is in a lowered position of said second set of confinement rings.

2. The plasma reactor of claim 1, wherein the volume of said first notch is greater than the volume of said first set of confinement rings, such that at least two confinement rings of said first set of confinement rings are disposed inside said first notch when said first set of confinement rings is in said raised position of said first set of confinement rings.

3. The plasma reactor of claim 1, wherein said first set of confinement rings is configured to be raised when said second set of confinement rings is raised, and said first set of confinement rings is configured to be lowered when said second set of confinement rings is lowered.

4. The plasma reactor of claim 1, wherein said first set of confinement rings and said second set of confinement rings are suspended.

5. The plasma reactor of claim 1, wherein said first set of confinement rings include an adjustable gap between each confinement ring.

6. The plasma reactor of claim 1 wherein said second set of confinement rings include an adjustable gap between each confinement ring.

7. The plasma reactor of claim 1, wherein said first set of confinement rings is adjacent to said top electrode such that an active electrode area ratio is substantially near unity.

8. The plasma reactor of claim 1, wherein said second set of confinement rings is positioned such that an active electrode area is substantially greater than unity.

9. The plasma reactor of claim 1, further comprising a power supply coupled to said bottom electrode, said bottom electrode configured to receive a workpiece.

10. The plasma reactor of claim 9, wherein said power supply generates a plurality of frequencies to said bottom electrode.

11. The plasma reactor of claim 1, wherein said top electrode extends beyond said second set of confinement rings in a horizontal direction.

12. The plasma reactor of claim 1, further comprising a ground extension adjacent to said bottom electrode, said ground extension electrically connected to said top electrode and included in an active electrode area ratio.

13. The plasma reactor of claim 1, further comprising a dielectric ring adjacent and surrounding said bottom electrode.

14. A plasma reactor comprising:
    a chamber;
    a bottom electrode and a top electrode enclosed within said chamber, wherein said top electrode and said bottom electrode are separated by a vertical distance, said top electrode including a first notch and a second notch, said top electrode further including a top electrode portion disposed between said first notch and said second notch;
    a first set of confinement rings having a first diameter, said first set of confinement rings being surrounded by said top electrode portion, said first set of confinement rings including a first plurality of confinement rings, all confinement rings of said first plurality of confinement rings being disposed inside said first notch, said first set of confinement rings surrounding a first volume between said bottom electrode and said top electrode when said first set of confinement rings is in a lowered position of said first set of confinement rings; and
    a second set of confinement rings having a second diameter, said second diameter being greater than said first diameter, said second set of confinement rings surrounding said top electrode portion, said second set of confinement rings including a second plurality of confinement rings, all confinement rings of said second plurality of confinement rings being disposed inside said second notch, said second set of confinement rings surrounding a second volume between said bottom electrode and said top electrode when said second set of confinement rings is in a lowered position of said second set of confinement rings.

15. The plasma reactor of claim 14, wherein said first set of confinement rings is configured to be lowered when said second set of confinement rings is raised, and said first set of confinement rings is configured to be raised when said second set of confinement rings is lowered.

16. The plasma reactor of claim 14, wherein said top electrode portion is disposed between said first set of confinement rings and said second set of confinement rings when said first set of confinement rings is in said raised position of said first set of confinement rings and said second set of confinement rings is in said raised position of said second set of confinement rings.

17. A plasma reactor comprising:
    a chamber;
    a bottom electrode and a top electrode enclosed within said chamber, wherein said top electrode and said bottom electrode are separated by a vertical distance, said top electrode including a first notch and a second notch, said top electrode further including a top electrode portion disposed between said first notch and said second notch;
    a first set of confinement rings surrounded by said top electrode portion, said first set of confinement rings including a first plurality of confinement rings, all confinement rings of said first plurality of confinement rings being disposed inside said first notch, said first set of confinement rings surrounding a first volume between said bottom electrode and said top electrode when said set of first set of confinement rings is in a lowered position of said first set of confinement rings; and
    a second set of confinement rings surrounding said top electrode portion, said second set of confinement rings including a second plurality of confinement rings, all confinement rings of said second plurality of confinement rings being disposed inside said second notch, said second set of confinement rings surrounding a second volume between said bottom electrode and said top electrode when said second set of confinement rings is in a lowered position of said second set of confinement rings, wherein said first set of confinement rings and second set of confinement rings are concentric.

18. The plasma reactor of claim 17, wherein said first set of confinement rings is configured to be lowered when said second set of confinement rings is raised, and said first set of confinement rings is configured to be raised when said second set of confinement rings is lowered.

19. The plasma reactor of claim 17, wherein said at least two concentric set of confinement rings are configured to be raised and lowered together.

20. The plasma reactor of claim 17, wherein the ground extension is located directly under both the first and second sets of confinement rings.

21. A plasma reactor comprising:

a chamber;

a bottom electrode and a top electrode enclosed within said chamber; wherein said top electrode is grounded and said bottom electrode is energized by a power source, said top electrode and said bottom electrode separated by a vertical distance, said top electrode including a first notch and a second notch, said top electrode further including a top electrode portion disposed between said first notch and said second notch;

a ground extension adjacent to and surrounding the bottom electrode;

a first set of confinement rings surrounded by said top electrode portion, said first set of confinement rings including a first plurality of confinement rings, all confinement rings of said first plurality of confinement rings being disposed inside said first notch; and a second set of confinement rings surrounding said top electrode portion, said second set of confinement rings including a second plurality of confinement rings, all confinement rings of said second plurality of confinement rings being disposed inside said second notch, wherein positions of said first set of confinement rings and said second set of confinement rings are adjustable to generate a plurality of bias-affecting effective surface areas for said top electrode.

22. The plasma reactor of claim 21, wherein the first set of confinement rings confine plasma within the first volume when in the lowered positioned and the second set of confinement rings confinement plasma within the second volume.

23. The plasma reactor of claim 21, wherein the ground extension is located beneath the entire first set of confinement rings.

* * * * *